United States Patent
Jaehne et al.

(10) Patent No.: US 6,747,519 B2
(45) Date of Patent: Jun. 8, 2004

(54) PHASE-LOCKED LOOP WITH AUTOMATIC FREQUENCY TUNING

(75) Inventors: Rolf Jaehne, Ottendorf-Okrilla (DE); Wolfram Kluge, Dresden (DE); Thorsten Riedel, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/361,086

(22) Filed: Feb. 7, 2003

(65) Prior Publication Data

US 2004/0000956 A1 Jan. 1, 2004

(30) Foreign Application Priority Data

Jun. 28, 2002 (DE) .......................... 102 29 130

(51) Int. Cl.$^7$ ................................. H03L 7/08
(52) U.S. Cl. ........................ 331/16; 331/179; 331/34; 331/17; 327/156; 327/160
(58) Field of Search ................ 331/16, 34, 179, 331/17; 327/156, 153, 159, 157, 160

(56) References Cited

U.S. PATENT DOCUMENTS 5,382,922 A  1/1995  Gersbach et al. ........... 331/1 A
6,496,556 B1 * 12/2002 Huehne et al. .............. 377/2
6,552,618 B2  4/2003  Nelson et al. ............... 331/11

FOREIGN PATENT DOCUMENTS

| DE | 33 13 868 A1 | 4/1983 |
| DE | 10056294 | 11/2000 |
| DE | 100 56 294 A1 | 11/2000 |
| GB | 2120478 | 11/1983 |
| JP | 2000004156 | 1/2000 |
| JP | 2000-4156 A | 7/2000 |
| JP | 2001-339298 A | 12/2001 |

* cited by examiner

*Primary Examiner*—Arnold Kinkead
(74) *Attorney, Agent, or Firm*—Meyertons Hood Kivlin Kowert & Goetzel, P.C.; B. Noël Kivlin

(57) ABSTRACT

A PLL frequency synthesizer able to automatically set an appropriate operating mode of the voltage controlled oscillator is provided. The voltage controlled oscillator is operable in a plurality of operating modes each defining a different operating frequency range of the voltage controlled oscillator. The appropriate operating mode is selected based on an error signal detected by a phase/frequency detector of the PLL frequency synthesizer. A window comparator is used for switching to adjacent operating modes if the error signal exceeds or falls below predefined upper and lower error voltage limits.

17 Claims, 4 Drawing Sheets

PHASE-LOCKED LOOP WITH AUTOMATIC FREQUENCY TUNING

BACKGROUND OF THE INVENTION

1. Field of the Invention

The present invention generally relates to a phase locked loop frequency synthesizer with automatic adjustment of a selected operating mode.

2. Description of the Related Art

A phase locked loop (PLL) frequency synthesizer is a circuit generating an output signal of a particular frequency that has a constant phase relationship to an input signal. The general configuration of a PLL frequency synthesizer is illustrated in the block diagram of FIG. 1. The PLL frequency synthesizer consists of a phase/frequency detector (PFD) 1, a low-pass filter 3 and a voltage controlled oscillator (VCO) 4. An input signal $F_{IN}$ is supplied to the phase/frequency detector 1 and the output signal $F_{OUT}$ of the VCO 4 is fed back to the phase/frequency detector 1. The phase/frequency detector 1 compares the phase of the input signal $F_{IN}$ to the phase of the feedback signal $F_{OUT}$. If both signals differ from each other, the phase/frequency detector outputs an error signal indicating the magnitude of the difference. The error signal controls the VCO 4 in that the frequencies of both input signals ($F_{IN}$, $F_{OUT}$) to the phase/frequency detector 1 finally match. The output signal ($F_{OUT}$) of the VCO will be coupled to the phase of the input signal ($F_{IN}$) when the phase difference falls below a particular error value.

The desired frequency of the VCO output signal $F_{OUT}$ is the frequency of the input signal $F_{IN}$. The output frequency of the output signal $F_{OUT}$ may be a multiple of the frequency of the input signal $F_{IN}$ by employing a feedback divider 5. The above described PLL frequency synthesizer represents the particular case using a dividing value of N=1.

Due to the effect of the feedback path in the phase locked loop, the VCO output signal $F_{OUT}$ will have a fixed phase relationship with respect to the input signal $F_{IN}$. The phases of the input and output signals will be synchronized with a minimal phase offset.

In many cases, a charge pump 2 is used to produce the tuning voltage for the VCO 4 based on the error signal output from the phase/frequency detector 1. A loop filter 3 connected between the charge pump and the VCO 4 is used to eliminate high frequency components from the VCO tuning voltage.

For low noise PLL applications, the loop gain of the VCO frequency control characteristic is one of the determining parameters. To achieve a low VCO phase noise, the PLL frequency synthesizer should have relatively low gain. In order to reduce the phase noise, VCOs are often designed by distributing the total operating frequency range on a plurality of operating frequency ranges. Such a VCO can reliably operate over a wide range of output frequencies using a relatively small VCO gain and a relatively small range of input voltages. The VCO is operated in one of a plurality of operating modes using a particular operating curve to generate an output frequency in response to the VCO input voltage. To achieve the desired PLL operation, that operating curve of the VCO has to be selected with the center frequency of the operating mode being close to the desired PLL output frequency.

A possible set of operating curves of a VCO is illustrated in FIG. 3. Each of the operating curves has a low gain and is operated by the same range of input voltages ranging from $V_{MIN}$ to $V_{MAX}$. One of the operating curves S is selected at a time by a particular digital control word applied to the VCO.

Conventionally, the operating curve having the appropriate center frequency is selected when the PLL is powered up. During normal PLL operations, the loop filter voltage is applied to the VCO.

During a procedure of automatic selecting an appropriate operating curve, a reference voltage $V_{REF}$ is supplied to the VCO input rather than the loop filter voltage. The reference voltage $V_{REF}$ is preferably the nominal center of the range of input voltages over which the VCO is designated to operate. As illustrated in FIG. 2 showing a configuration of a corresponding PLL frequency synthesizer, switches 7 and 8 are opened and closed accordingly.

The operating curve is selected by a control word supplied from a self-calibration circuitry 6. The self-calibrating circuitry 6 receives the PLL input signal $F_{IN}$ and the PLL feedback signal Four$_{OUT}$. The self-calibrating circuitry 6 comprises a frequency detector 9 a digital accumulator 10 and a state machine 11. This circuitry is only operated during power up to select an appropriate operating curve by providing a code word to the VCO 4.

During self-calibration, the digital control word applied to the VCO is determined by incrementally increasing the digital control world until the measuring result of frequency detector 9 indicates that the desired optimal operating mode of the VCO is selected. Such a phase locked looped based frequency synthesizer is described by W. B. Wilson et al. in "A CMOS self-calibrating frequency synthesizer" in IEEE Journal Of Solid-State Circuits, vol. 35, no. Oct. 10, 2000.

PLL frequency synthesizers, and in particular VCOs, still have a number of problems. One problem is that an automatic selection of the appropriate operating range is only possible at power up. Any change of the desired output frequency during operation or any compensation of large drift or temperature deviations will not be possible without interrupting the frequency synthesizing operation.

SUMMARY OF THE INVENTION

An improved PLL frequency synthesizer is provided to enable an automatic adaptation to the operating range appropriate for a desired output frequency.

In one embodiment, a PLL frequency synthesizer is provided comprising a voltage controlled oscillator, a phase/frequency detector and an operating mode determining unit. The voltage controlled oscillator is operable in a plurality of operating modes each defining a different operating frequency range of the voltage controlled oscillator. The phase/frequency detector generates an error signal based on a frequency input signal and a PLL feedback signal. The operating mode determining unit determines one of the operating modes of the voltage controlled oscillator based on the detected error signal. The operating mode determining unit includes a window comparator defining upper and lower error voltage limits for switching to adjacent operating modes when the error voltage exceeds or falls below the defined upper and lower voltage limits.

In a further embodiment, a method for controlling the operation of a voltage controlled oscillator in a PLL frequency synthesizer is provided. The voltage controlled oscillator is operable in a plurality of operating modes each of which defining a different operating frequency range of the voltage controlled oscillator. The method determines one of the operating modes of the voltage controlled oscillator based on an error signal between a frequency input signal and a PLL feedback signal. This determining step compares the error signal with predefined upper and lower error voltage limits for switching the current operating mode to an adjacent operating mode when the error signal exceeds or falls below the predefined upper or lower error voltage limits.

Further embodiments are the subject-matter of dependent claims.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention, as illustrated in the accompanying drawings wherein.

DETAILED DESCRIPTION OF THE INVENTION

Figure 1:
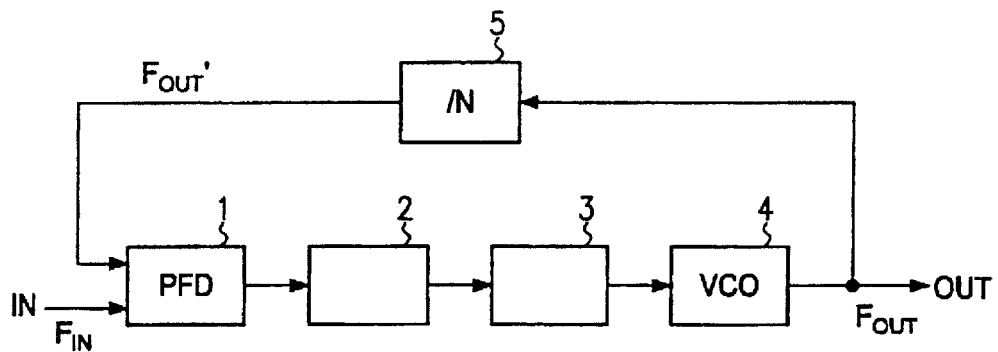
FIG. 1 illustrates a block diagram of a conventional charge pump phase locked loop.

The illustrative embodiments of the present invention will be described with reference to the figure drawings wherein like elements and structures are indicated by like reference numerals.

Figure 2:
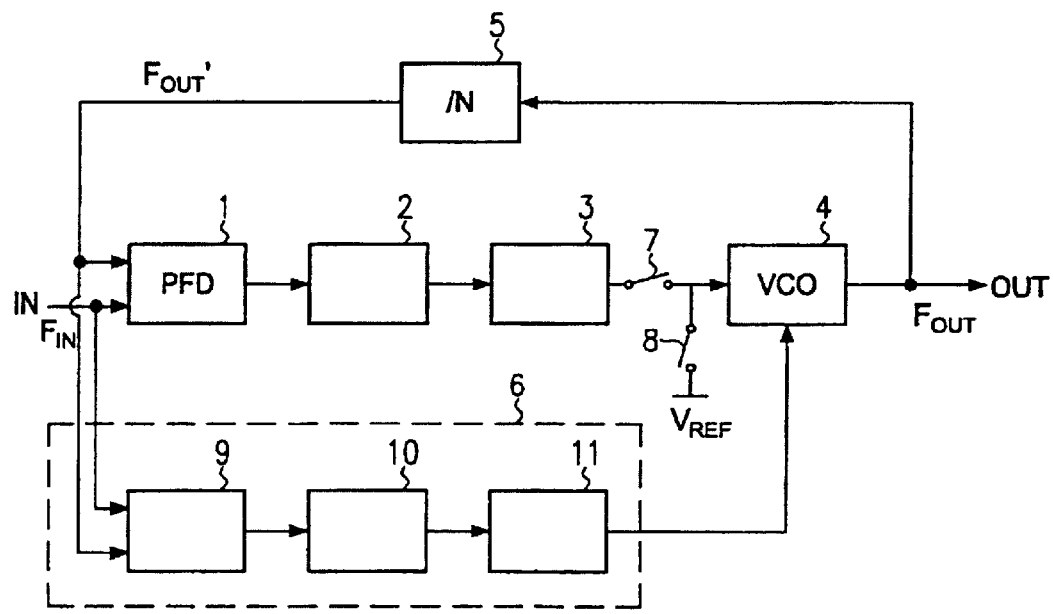
FIG. 2. Illustrates a block diagram of a self-calibrating phase locked loop including a charge pump.
Figure 3:
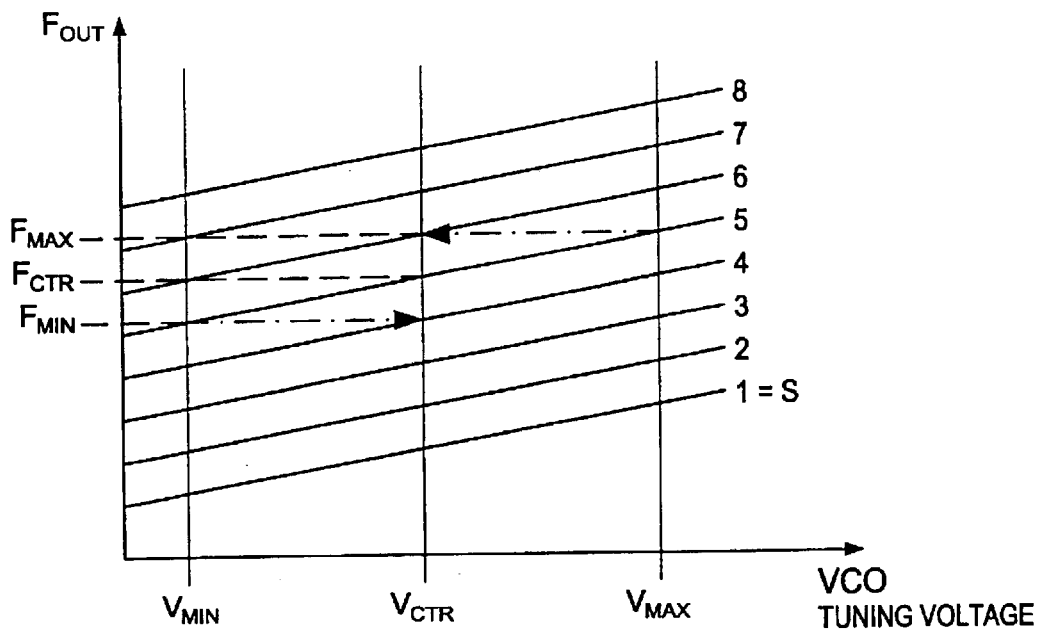
FIG. 3 shows a set of a possible operating curves for the voltage controlled oscillator of the phase locked loop as shown in FIG. 2.
Figure 4:
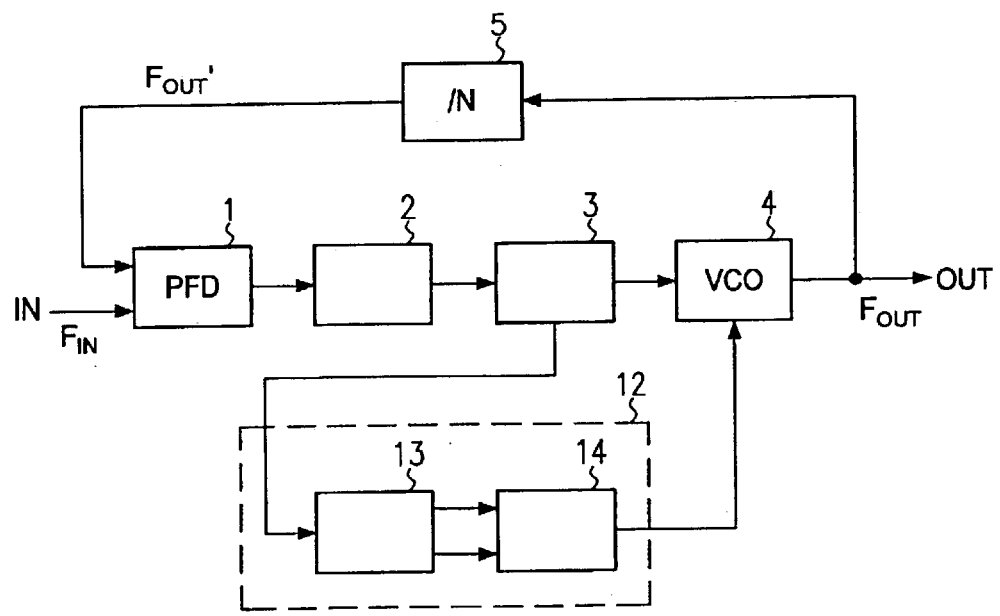
FIG. 4 shows a block diagram of an embodiment of a charge pump phase locked loop for automatic selecting an appropriate oscillator operating curve.

Referring now to the drawings and in particular to FIG. 4, which illustrates a charge pump phase locked loop as described herewith. In the configuration as shown in FIG. 4, the phase/frequency detector 1, charge pump 2, loop filter 3, voltage controlled oscillator 4, and PLL feedback divider 5 are generally analogous to the corresponding components of the charge pump phase locked loop as shown in FIG. 2. In addition, the phase locked loop of FIG. 44 comprises an operating mode determining unit 12 enabling the phase locked loop frequency synthesizer to automatically select an appropriate operating curve, either during power up or during operation. Loop filter 3 is similar to the loop filter 3 shown in FIG. 2, except that the loop filter provides a control signal supplied to the operating mode determining unit 12. The operating mode determining unit outputs a control word to select one of the operating curves of the VCO 4.

The operating mode determining unit 12 comprises a window comparator 13 and an up/down counter 14. Window comparator 13 monitors the VCO tuning voltage, i.e. the error signal and instructs the up/down counter 14 to increment or decrement the digital code word depending on the comparing result by an up or down signal. The output of the up/down counter 14 switches the operating mode S of the VCO 4 to an adjacent operating mode in order to adjust the VCO's operating range to the desired output frequency.

Figure 5:
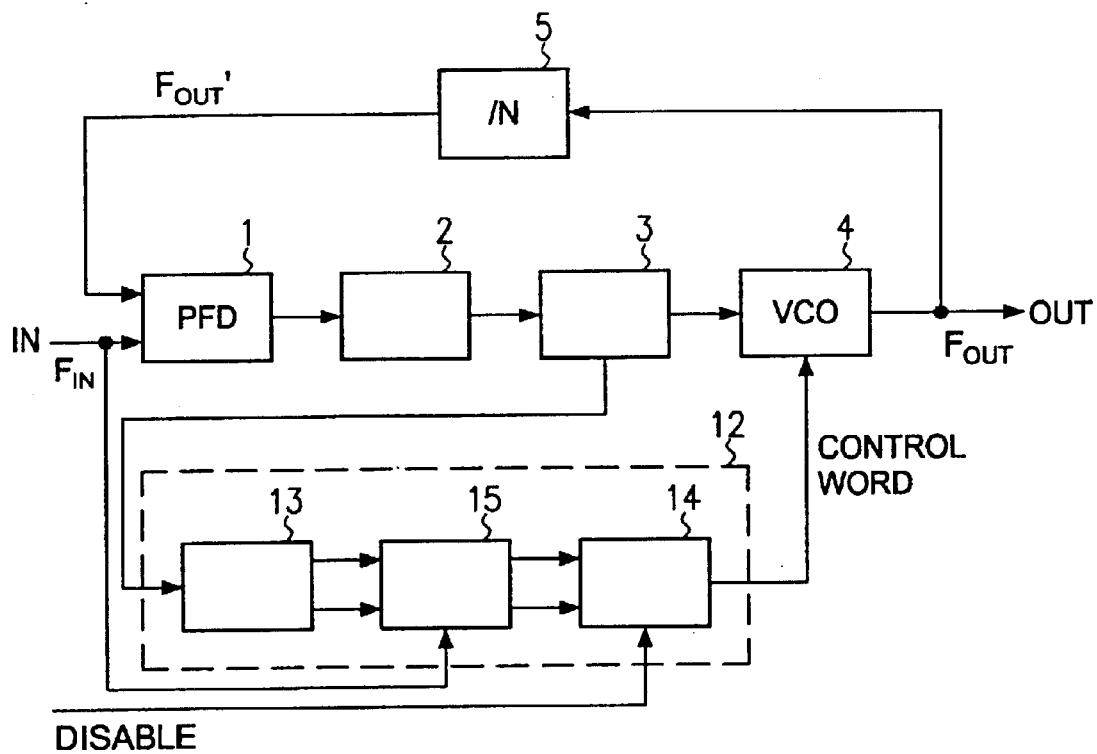
FIG. 5 illustrates a more detailed embodiment of a charge pump phase locked loop with automatic selection of an appropriate oscillator operating curve.

One particular configuration of an embodiment of the operating mode determining unit 12 is in FIG. 5. In the phase locked loop shown in FIG. 5, phase/frequency detector 1, charge pump 2, loop filter 3, voltage controlled oscillator 4 and feedback divider 5 are analog to the corresponding components of the phase locked loop shown in FIG. 4. The embodiment of FIG. 5 differs from the phase locked loop of FIG. 4 in the configuration of the operating mode determining unit 12. In the configuration of the operating mode determining mode 12, window comparator 13 and up/down counter 14 are similar to those described in connection with FIG. 4, except that a delay counter 15 is connected in between. The delay counter 15 serves for producing a stable operation of the VCO by generating a delay between a switching signal, i.e. a switching to a neighboring operating mode, from the window comparator and the operation of switching to the neighboring operating mode conducted by the up/down counter 14.

Delay counter 15 computes such a delay by counting a predetermined number of clocks before forwarding the up or down switching signal to the up/down counter 14. Preferably, delay counter 15 uses the input signal $F_{IN}$ as a clock signal. Those skilled in the art will appreciate that any other clock signal may be implemented to the same effect, i.e. to provide a predetermined delay.

In case an instruction to switch to an adjacent operating range is currently delayed and, during the delay period, the switching instruction is "overruled" by a subsequent output of window comparator 13, delay counter 15 is reset meaning that the switching instruction waiting to be forwarded to the up/down counter 14 is cancelled. Thus, a short time switching between neighboring operating modes may be avoided resulting in a more stable VCO operation.

According to a further embodiment, the operation of the up/down counter 14 may be set on hold by an external "disable" signal.

Preferably, the VCO tuning voltage, i.e. the error signal provided by a charge pump 2, is supplied to the operating mode determining unit 12. According to a preferred embodiment, the signal supplied to the operating mode determining unit is derived from within the loop filter 3 in order to low-pass filtering the VCO tuning voltage. By low-pass filtering the input signal supplied to the operating mode determining unit, the switching operations are smoothed resulting in a more stable VCO operation.

Figure 6:
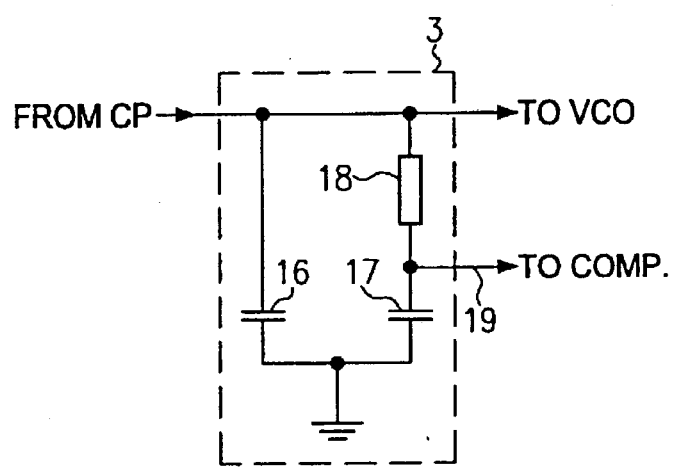
FIG. 6 is an example of a loop filter for use with a charge pump phase locked loop as shown in FIG. 4.

FIG. 6 illustrates an example of a loop filter 3 which may be used in the phase locked loop frequency synthesizers as shown in FIG. 4 or 5. In particular, loop filter 3 includes a pair of capacitors 16 and 17 and a resistor 18. The window comparator 13 includes an input connected between resistor 18 and a capacitor 17. With this configuration, the operating mode determining unit receives a smoothed input signal. Those skilled in the art will appreciate that any other means for smoothing the operating mode determining unit input may be implemented.

Figure 7:
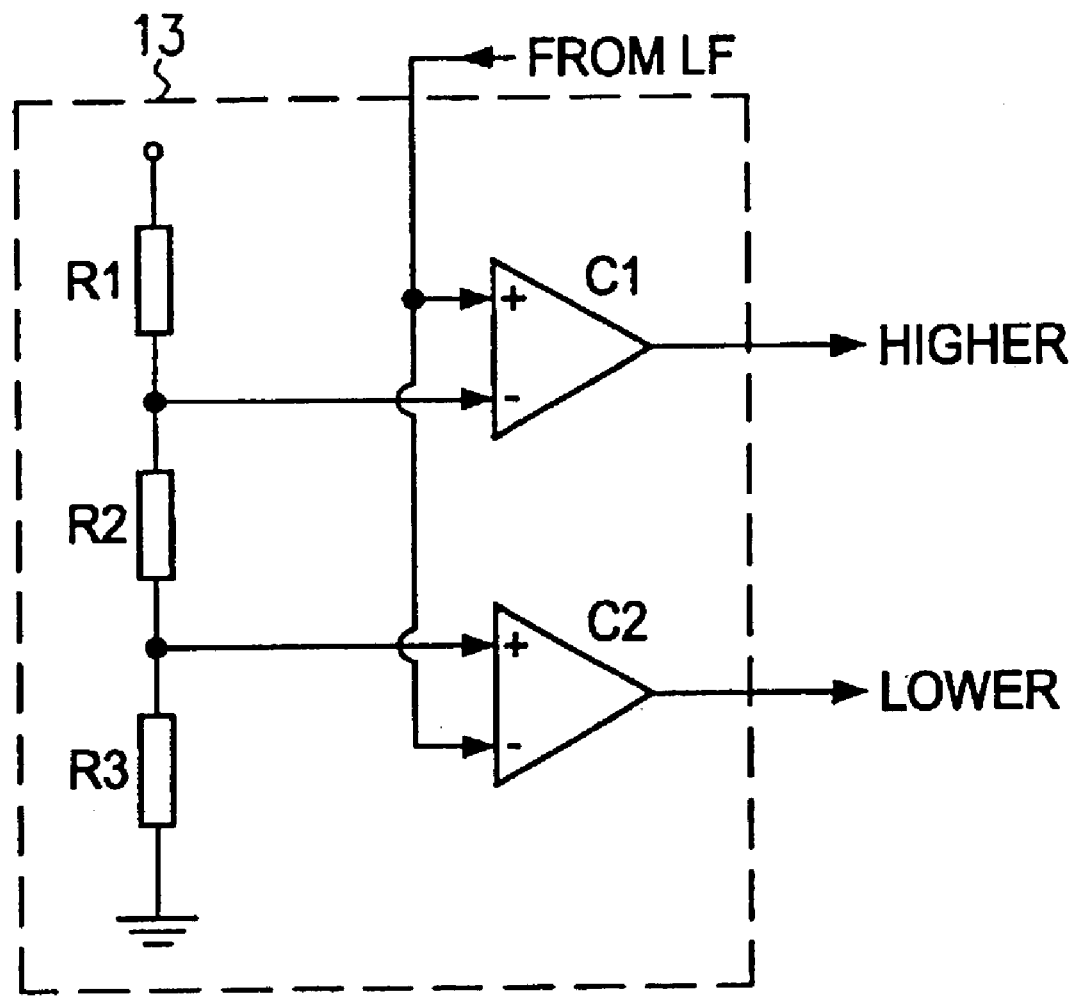
FIG. 7 shows an example of a window comparator for use in an operating mode determining unit as shown in FIG. 4.

A specific example of an embodiment of window comparator 13 is illustrated in FIG. 7. It is the purpose of the window comparator to monitor the VCO turning voltage and to digitally instruct up/down counter 14 when the VCO tuning voltage moves above or below the predefined voltage settings. The voltage "window" may be adjusted using different resistor values. The comparator of FIG. 7 consists of resistors R1, R2, and R3 creating a voltage divider. The voltage divider defines the upper and lower voltage limits of the voltage "window". By reducing the resistor value of R2, the size of the window may be reduced. Larger values of R2 will increase the window size. These predefined voltages are connected to comparators C1 and C2, respectively. Each of these comparators compares the received VCO tuning voltage with one of the predefined voltages and outputs the result "higher" or "lower" to the up/down counter 14, wherein these comparing results may be passed through delay counter 15 as described above.

According to the various embodiments described above, the VCOs operation may be automatically adjusted to a desired output voltage in a low noise PLL frequency synthesizer. An appropriate operating mode is automatically selected during operation based on the VCOs tuning voltage.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. In addition, those areas in which it is believed that those of ordinary skill in the art are familiar, have not be described herein in order to not unnecessarily obscure the invention described therein. Accordingly, it is to be understood that the invention is not to be limited by the specific illustrative embodiments, but only by the scope of the appended claims.

What is claimed is:

1. A PLL frequency synthesizer, comprising:
a voltage controlled oscillator in a plurality of operating modes each defining a different operating frequency range of the voltage controlled oscillator;
a phase/frequency detector for generating an error signal based on a frequency input signal and a PLL feedback signal; and
an operating mode determining unit for determining one of the operating modes of the voltage controlled oscillator based on the error signal,
wherein said operating mode determining unit includes a window comparator configured to compare the error signal with predefined upper and lower error voltage limits for switching to adjacent operating modes when the error signal exceeds or falls below the upper or lower error voltage limits and includes a delay counter for delaying the switching between adjacent operating modes, and wherein the operating frequency ranges of adjacent operating modes overlap by predefined portion of the respective operating frequency range.

2. The PLL frequency synthesizer according to claim 1, wherein said overlap corresponds to approximately half of the operating frequency range.

3. The PLL frequency synthesizer according to claim 1, wherein said operating frequency range being determined by a linear and usable working range of a tuning voltage of the voltage controlled oscillator.

4. The PLL frequency synthesizer according to claim 1, wherein said window comparator comprises two comparators for monitoring the upper and lower error voltage limits.

5. The PLL frequency synthesizer according to claim 1, wherein said operating mode determining unit further comprises an up/down counter for selecting a particular operation mode by generating a digital control word which is supplied to the voltage controlled oscillator.

6. The PLL frequency synthesizer according to claim 5, wherein said up/down counter increments or decrements the digital control word based on a comparator output.

7. The PLL frequency synthesizer according to claim 1, wherein a count value of said delay counter is reset after switching to a new operating mode.

8. The PLL frequency synthesizer according to claim 7, wherein said delay counter delays a switching signal from said window comparator for selecting an adjacent operating mode supplied to said up/down counter by a predetermined number of clock cycles.

9. The PLL frequency synthesizer according to claim 1, wherein a count value of said delay counter is reset when the window comparator output indicates to maintain a current operating mode within the applied delay period.

10. The PLL frequency synthesizer according to claim 1, wherein a tuning voltage of said voltage controlled oscillator is supplied to said operating mode determining unit.

11. The PLL frequency synthesizer according to claim 10, further comprising a loop filter filtering said tuning voltage of said voltage controlled oscillator wherein the signal supplied to said operating mode determining unit being derived from within said loop filter.

12. The PLL frequency synthesizer according to claim 1, wherein said operating mode determining unit being adapted that the operation of the operation mode determining unit may be set on hold by an external input signal.

13. A method for controlling the operation of a voltage controlled oscillator in a PLL frequency synthesizer, said voltage controlled oscillator being operable in a plurality of operating modes each defining a different operating frequency range of the voltage controlled oscillator, comprising the steps of:
generating an error signal based on a frequency input signal and a PLL feedback signal;
determining one of the operating modes of the voltage controlled oscillator based on the error signal, wherein said determining step compares the error signal with predefined upper and lower error voltage limits for switching to adjacent operating modes when the error signal exceeds or falls below the upper or lower error voltage limits; and
delaying a switching signal by a predetermined time period, said switching signal for switching to an adjacent operating range, wherein the operating frequency ranges of adjacent operating modes overlap by predefined portion of the respective operating frequency range.

14. The method for controlling the operation of a voltage controlled oscillator according to claim 13, wherein said overlap corresponds to approximately half of the operating frequency range.

15. The method for controlling the operation of a voltage controlled oscillator according to claim 13, wherein said operating frequency range being determined by a linear and usable working range of a tuning voltage of the voltage controlled oscillator.

16. The method for controlling the operation of a voltage controlled oscillator according to claim 13, wherein a digital control word for selecting one of the operating modes is incremented or decremented if the error signal exceeds the upper error voltage limit or falls below the lower error voltage limit.

17. The method for controlling the operation of a voltage controlled oscillator according to claim 13, wherein a delayed switching signal for selecting an adjacent operating mode is deleted if a subsequent comparing result indicates during said predetermined delay period to maintain a current operating mode.

* * * * *